United States Patent
Okada

(10) Patent No.: US 9,997,365 B2
(45) Date of Patent: Jun. 12, 2018

(54) METHOD OF MANUFACTURING SEMICONDUCTOR DEVICE, HEAT TREATMENT APPARATUS, AND STORAGE MEDIUM

(71) Applicant: TOKYO ELECTRON LIMITED, Tokyo (JP)

(72) Inventor: Mitsuhiro Okada, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days. days.

(21) Appl. No.: 15/621,138

(22) Filed: Jun. 13, 2017

(65) Prior Publication Data

US 2017/0358458 A1     Dec. 14, 2017

(51) Int. Cl.
| | |
|---|---|
| H01L 21/302 | (2006.01) |
| H01L 21/461 | (2006.01) |
| H01L 21/3065 | (2006.01) |
| H01L 21/02 | (2006.01) |
| H01L 21/3105 | (2006.01) |
| H01L 21/67 | (2006.01) |

(52) U.S. Cl.
CPC .... *H01L 21/3065* (2013.01); *H01L 21/02532* (2013.01); *H01L 21/02598* (2013.01); *H01L 21/31053* (2013.01); *H01L 21/67069* (2013.01); *H01L 21/67103* (2013.01)

(58) Field of Classification Search
USPC .......................................... 438/715
See application file for complete search history.

(56) References Cited

U.S. PATENT DOCUMENTS

2012/0064709 A1\* 3/2012 Jeon ................. H01L 21/28273
                                                                    438/593

FOREIGN PATENT DOCUMENTS

| JP | 2008-166513 A | 7/2008 |
|---|---|---|
| JP | 5514162 A | 4/2014 |
| JP | 5813495 B2 | 10/2015 |

\* cited by examiner

*Primary Examiner* — Roberts Culbert
(74) *Attorney, Agent, or Firm* — Nath, Goldberg & Meyer; Jerald L. Meyer

(57) ABSTRACT

A method of manufacturing a semiconductor device includes: loading a substrate into a process container after dry-etching a portion of a silicon film formed in a recess on the substrate; performing etching to partially or entirely remove the silicon film remaining on a side wall inside the recess by supplying an etching gas selected from a hydrogen bromide gas and a hydrogen iodide gas into the process container of a vacuum atmosphere while heating the substrate; subsequently forming a silicon film inside the recess; and heating the substrate to increase a grain size of the silicon film.

10 Claims, 12 Drawing Sheets

METHOD OF MANUFACTURING SEMICONDUCTOR DEVICE, HEAT TREATMENT APPARATUS, AND STORAGE MEDIUM

CROSS-REFERENCE TO RELATED APPLICATION

This application is based upon and claims the benefit of priority from Japanese Patent Application No. 2016-118196, filed on Jun. 14, 2016, the entire contents of which are incorporated herein by reference.

TECHNICAL FIELD

The present disclosure relates to a technique of forming a silicon-made conductive path in a recess formed in a surface of a substrate.

BACKGROUND

In recent years, in order to cope with three-dimensionalization of semiconductor devices, various designs are also required for semiconductor manufacturing processes. For example, as a process of forming a 3DNAND channel, there is a process of forming a silicon (e.g., polysilicon) film constituting a conductive path in a recess having a high aspect ratio and dry-etching the silicon film. As a specific example, there is a process of forming a recess in a silicon oxide layer, forming a monocrystalline silicon layer on the bottom of the recess, covering the inside of the recess with a silicon film, and then removing the silicon film on the bottom by anisotropic etching, which is dry etching, to expose the monocrystalline silicon layer.

After the dry etching, it is necessary to remove a residue generated at the time of the dry etching. For example, in wet etching, if the aspect ratio is high and the cross section of the recess is minute, it is difficult to etch the silicon film in the recess with high uniformity in the depth direction to remove an etching residue. For this reason, the same silicon (e.g., polysilicon) film is stacked on the surface of the silicon film to form a silicon film electrically connected to the monocrystalline silicon layer while leaving the etching residue. In order to improve the conductivity of the silicon film, it is necessary to increase the grain size of the silicon by performing annealing. The grain size grows larger as the film thickness of the silicon film increases. However, when a silicon film is further formed on the surface of the silicon film to which impurities such as an etching residue and the like adhere, the film thickness becomes as small as the interposed impurities, which results in reducing an increase in grain size.

There is also known a dry etching process of silicon using a chlorine ($Cl_2$) gas. However, when the $Cl_2$ gas is used for etching an inner surface of a recess formed in a wafer, the etching amount near the opening of the recess becomes large, so that the inner surface of the recess is etched in a V-like shape. This makes it difficult to assure high uniformity in the depth direction. In addition, when chlorine used as an etching gas adheres to a wall surface and a silicon film is further formed after the etching, the silicon film is etched, which causes a problem in that the film formation rate is reduced or the surface roughness after film formation has deteriorated.

SUMMARY

Some embodiments of the present disclosure provide a technique of forming a silicon film having excellent conductivity when forming a silicon-made conductive path in a recess formed in a substrate.

According to one embodiment of the present disclosure, there is provided a method of manufacturing a semiconductor device, including: loading a substrate into a process container after dry-etching a portion of a silicon film formed in a recess on the substrate; performing etching to partially or entirely remove the silicon film remaining on a side wall inside the recess by supplying an etching gas selected from a hydrogen bromide gas and a hydrogen iodide gas into the process container of a vacuum atmosphere while heating the substrate; subsequently forming a silicon film inside the recess; and heating the substrate to increase a grain size of the silicon film.

According to another embodiment of the present disclosure, there is provided a heat treatment apparatus configured to mount a substrate for manufacturing a semiconductor device on a mounting part provided in a process container for forming a vacuum atmosphere and to perform a heat treatment with respect to the substrate by supplying a process gas while vacuum-exhausting an interior of the process container and heating the substrate. The heat treatment apparatus includes a control part configured to output a control signal so as to perform: loading the substrate into the process container after dry-etching a portion of a silicon film formed in a recess on the substrate; etching to remove an etching residue of a surface portion of a silicon film remaining on a side wall inside the recess or the silicon film by supplying an etching gas selected from a hydrogen bromide gas and a hydrogen iodide gas into the process container of a vacuum atmosphere while heating the substrate; subsequently forming a silicon film inside the recess; and heating the substrate to increase a grain size of the silicon film.

According to another embodiment of the present disclosure, there is provided a non-transitory computer-readable storage medium storing a computer program used in a heat treatment apparatus configured to mount a substrate for manufacturing a semiconductor device on a mounting part provided in a process container for forming a vacuum atmosphere and to perform a heat treatment with respect to the substrate by supplying a process gas while vacuum-exhausting an interior of the process container and heating the substrate. The computer program includes a group of steps so as to execute the aforementioned method of manufacturing the semiconductor device.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
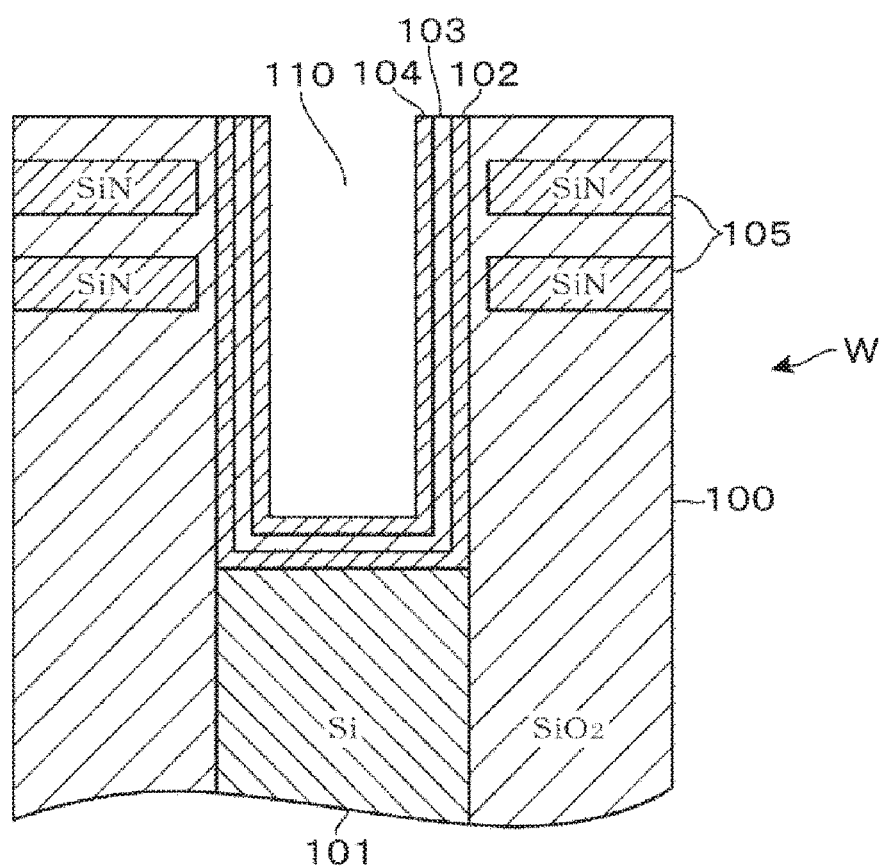
FIG. 1 is a sectional view showing the vicinity of a surface of a wafer according to a first embodiment.

An example of a surface structure of a wafer W which is a substrate for manufacturing a semiconductor device used in a method of manufacturing a semiconductor device according to a first embodiment will be described. FIG. 1 shows a surface structure of a wafer W in the course of a manufacturing process of a semiconductor device. In this surface structure, a recess 110 is formed in a silicon oxide layer ($SiO_2$ layer) 100. A monocrystalline silicon layer 101 is positioned below the recess 110. On the inner circumferential surface of the recess 110, a silicon nitride film (SiN film) 102, a silicon oxide film ($SiO_2$ film) 103, and a first silicon (Si) film 104 made of polysilicon are formed in this order from the lower layer side.

Further, the surface of the wafer W is polished by, for example, CMP (Chemical Mechanical Polishing), whereby the SiN film 102, the $SiO_2$ film 103 and the first Si film 104 on the surface are removed to expose the $SiO_2$ layer 100. FIG. 1 shows the surface structure of the wafer W after polishing. A SiN layer 105 is buried in a region of the wafer W where the recess 110 is not formed. Although the silicon nitride film is theoretically represented by $Si_3N_4$, it is abbreviated as "SiN film" in the present disclosure. The aspect ratio (depth/line width) of the recess 110 (the portion surrounded by the first Si film 104) thus formed is, for example, 50 to 150.

Figure 2:
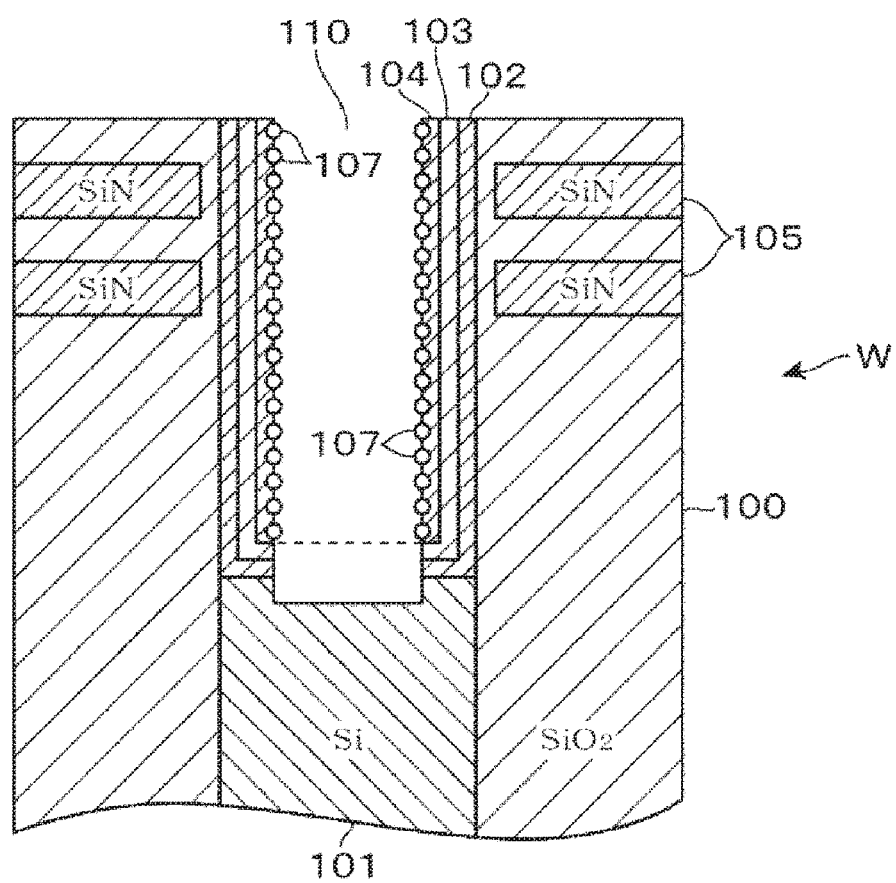
FIG. 2 is an explanatory view showing the vicinity of a surface of a wafer after anisotropic etching.

The wafer W is transferred to a dry etching apparatus. In the dry etching apparatus, as shown in FIG. 2, the first Si film 104, the $SiO_2$ film 103 and the SiN film 102 formed at the bottom portion of the recess 110 are sequentially etched by the plasma of a process gas under a vacuum atmosphere, whereby the monocrystalline crystal silicon layer 101 formed below the recess 100 is exposed. Since the series of etching is performed as anisotropic etching, the first Si film 104 formed on the side wall of the recess 110 remains without being removed. A residue 107 generated during the etching adhere to the side surface of the recess 110 (the surface of the first Si film 104). Since the bottom surface of the recess 110 (the exposed surface of the monocrystalline silicon layer 101) comes into contact with the atmospheric atmosphere after the etching process, a natural oxide film is formed on the bottom surface of the recess 110. Therefore, the wafer W is loaded into, for example, a liquid processing apparatus for performing the well-known process of wet etching, within a predetermined period of time during which the wafer W is loaded into a vertical heat treatment apparatus to be described later.

Figure 3:
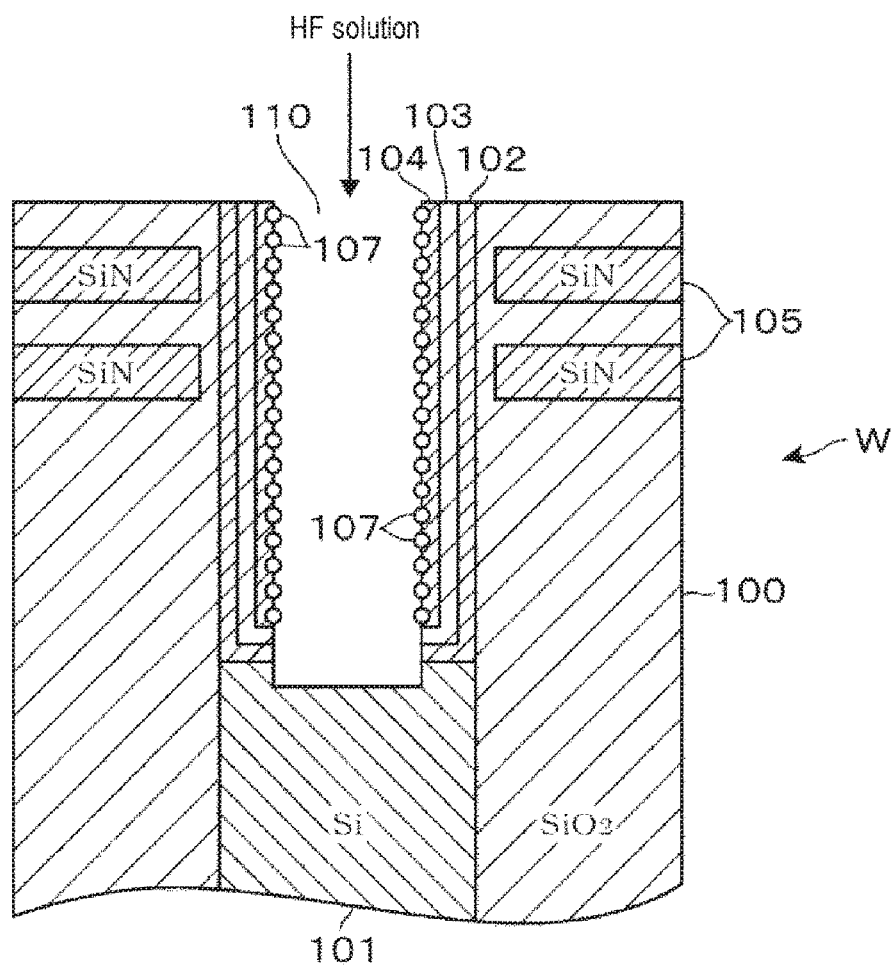
FIG. 3 is an explanatory view schematically showing the removal of a natural oxide film in a recess.

As shown in FIG. 3, for example, a dilute hydrofluoric acid solution (HF) is supplied to the wafer W loaded into the liquid processing apparatus, whereby the natural oxide film formed on the inner surface of the recess 110, particularly the natural oxide film on the surface of the monocrystalline silicon layer 101, which becomes a resistor in a conductive path, is etched to be removed by HF. Techniques of the etching process include a technique of supplying an etching solution from an upper nozzle to a wafer W while rotating the wafer W sucked on a spin chuck and a technique of collectively immersing a plurality of wafers W into an etching tank storing HF.

Figure 4:
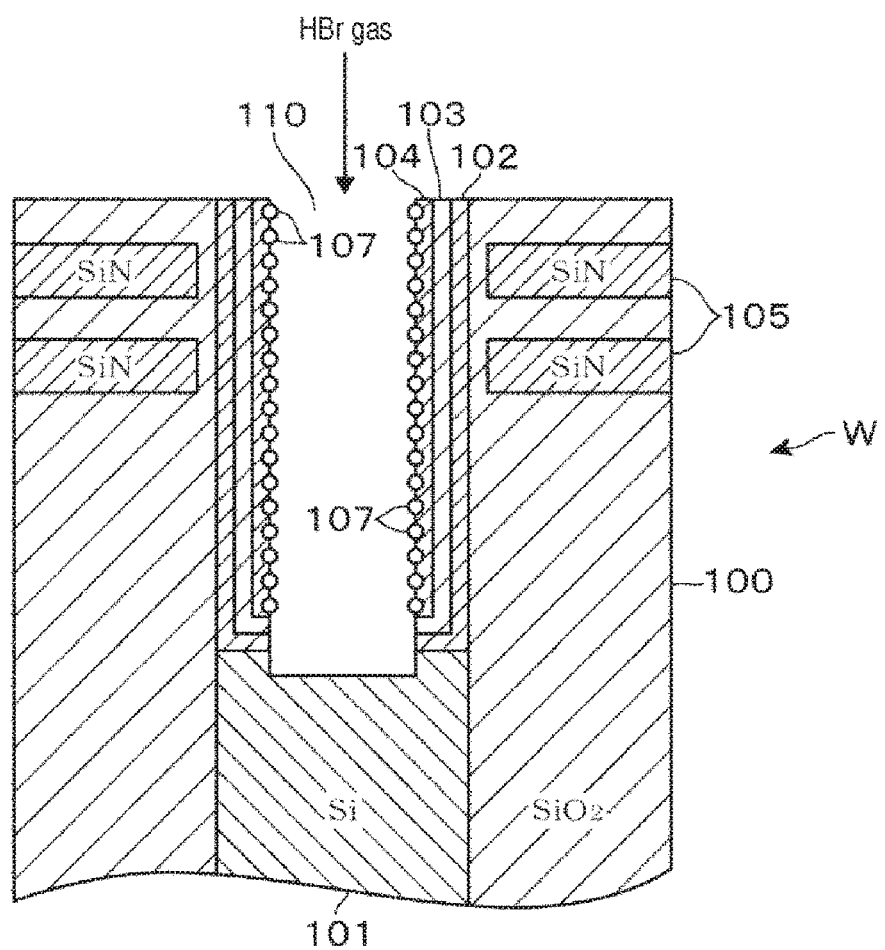
FIG. 4 is an explanatory view schematically showing the removal of a first Si film.
Figure 5:
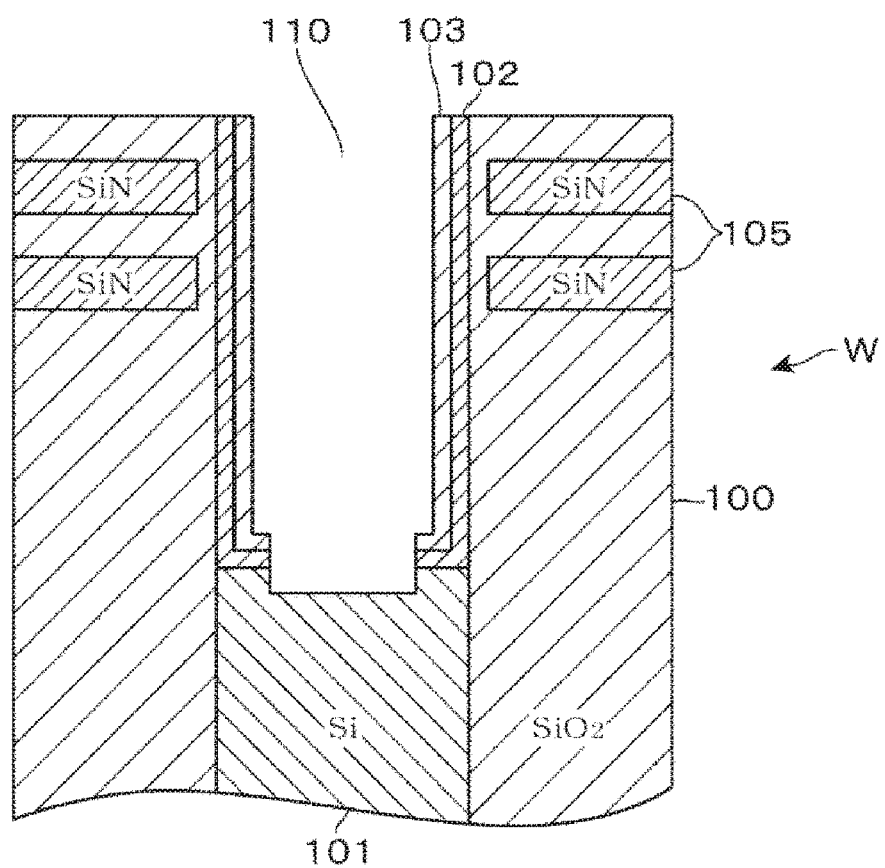
FIG. 5 is a sectional view showing the vicinity of a surface of a wafer from which a first Si film is removed.

Thereafter, the wafer W is transferred to, for example, a vertical heat treatment apparatus to be described later, to perform the respective processes of etching the first Si film 104, and forming a second Si film and performing thermal annealing. Detailed conditions of the respective processes will be described when describing the operation of the vertical heat treatment apparatus. First, as shown in FIG. 4, an HBr gas is supplied to the wafer W. The wafer W is heated, for example, at 550 degrees C. As shown in verification test 1 to be described later, the HBr gas etches the first Si film 104 formed on the side wall of the recess 110, with high uniformity in the depth direction of the recess 110. Accordingly, the etching residue 107 adhering to the side wall of the recess 110 and the layer damaged during the etching (the layer roughened by being exposed to an etching gas component) near the surface are removed with high uniformity in the depth direction of the recess 110. As shown in verification test 2 to be described later, the HBr gas can etch Si with extremely high selectivity with respect to $SiO_2$ and SiN. Therefore, the $SiO_2$ film 103 or the SiN film 102, which is an underlayer of the first Si film 104, is not substantially etched. As a result, as shown in FIG. 5, the recess 110 becomes a state in which the first Si film 104 is removed.

Figure 6:
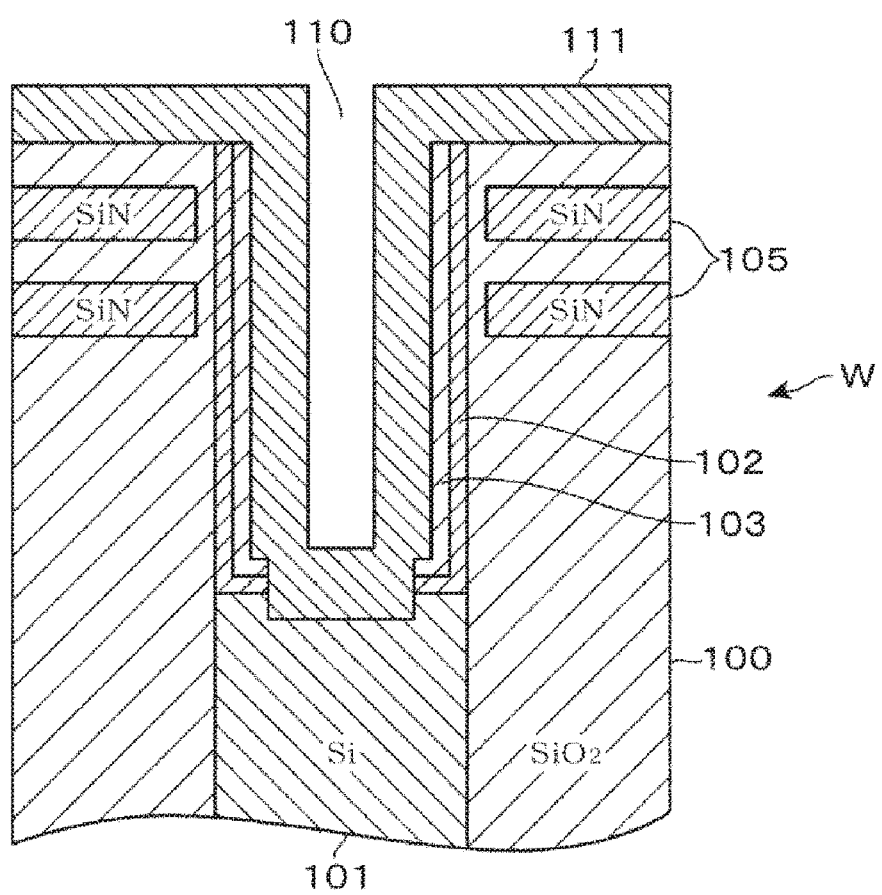
FIG. 6 is a sectional view showing the vicinity of a surface of a wafer after a second Si film is formed.

Thereafter, a second Si film 111 made of polysilicon is formed in a vacuum atmosphere at a process temperature of, for example, 450 degrees C. or higher. The $SiO_2$ film 103 is exposed at the side surface of the recess 110, and the monocrystalline silicon layer 101 is exposed at the bottom surface of the recess 110. As shown in FIG. 6, the second Si film 111 is formed to adhere to the $SiO_2$ film 103 and the monocrystalline silicon layer 101.

Figure 7:
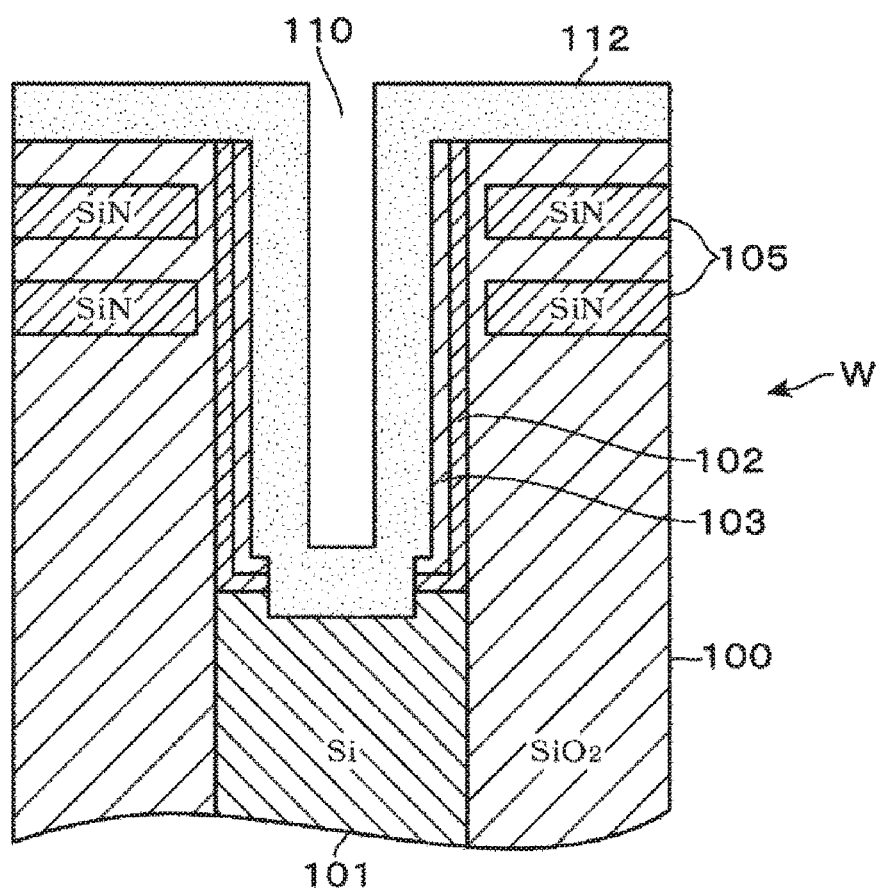
FIG. 7 is a sectional view showing the vicinity of a surface of a wafer after an annealing process is performed.

Furthermore, the wafer W is heated to, for example, 450 to 950 degrees C., to increase the grain size of Si in the second Si film 111 as shown in FIG. 7. In FIG. 7, the portion denoted by reference numeral 112 indicates the second Si film in which the grain size is increased after heating. In this way, for example, a channel (conductive path) of a NAND circuit, which is formed of polysilicon (second Si film 112), is formed in the recess 110. Thereafter, the wafer W is transferred to, for example, a CMP apparatus where the Si film on the surface of the wafer W is removed to expose the $SiO_2$ layer 100.

Figure 8:
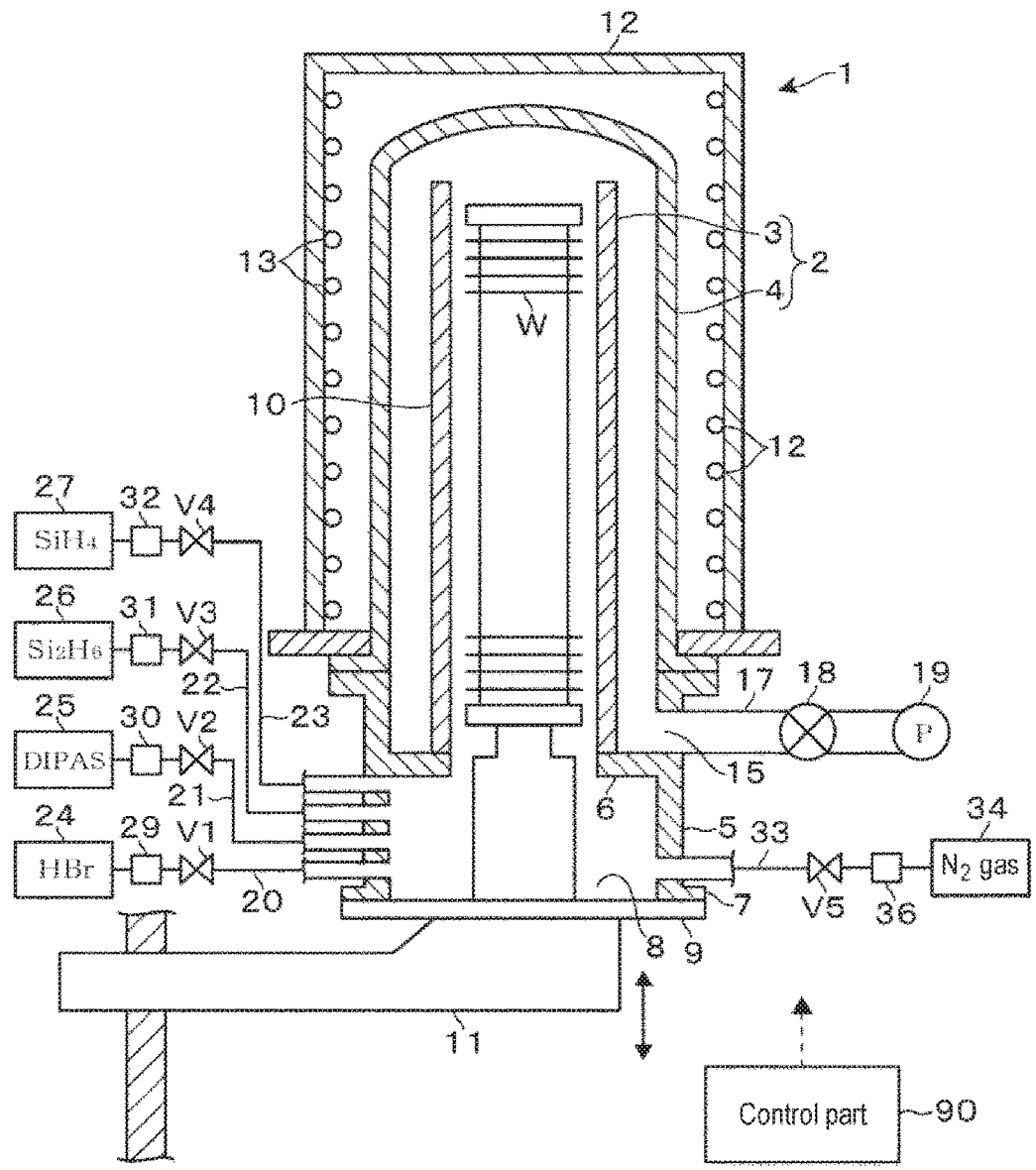
FIG. 8 is a sectional view showing a vertical heat treatment apparatus.

The method of manufacturing a semiconductor device according to the embodiment of the present disclosure is performed by a semiconductor manufacturing system which includes, for example, the above-described liquid processing apparatus and a vertical heat treatment apparatus for performing the etching of the first Si film 104, the formation of the second Si film 111 and the annealing of the second Si film 111. Here, a vertical heat treatment apparatus and an example of a process using the vertical heat treatment apparatus will be described. As shown in FIG. 8, the vertical heat treatment apparatus 1 includes a quartz-made reaction vessel 2 configured in a cylindrical shape with a ceiling, which extends in the vertical direction. The reaction vessel 2 includes a cylindrical inner tube 3 and a cylindrical outer tube 4 with a ceiling provided so as to cover the inner tube 3 and spaced apart from the inner tube 3. The periphery of the reaction vessel 2 is surrounded by a heat insulating body 12. On the inner surface of the heat insulating body 12, a temperature raising heater 13 for heating the wafer W is provided over the entire circumference.

A tubular manifold 5 made of stainless steel and airtightly connected to the outer tube 4 is provided below the outer tube 4. A flange 7 is formed at the lower end of the manifold 5. Inside the manifold 5, a ring-shaped support portion 6 is formed. The lower end of the aforementioned inner tube 3 is connected to the support portion 6. The region surrounded by the flange 7 is opened as a substrate loading/unloading port 8 and is airtightly closed by a circular lid 9 made of quartz. At the central portion of the lid 9, a wafer boat 10, which is a substrate holding part formed in a shelf shape so that wafers W are mounted in a vertically spaced-apart relationship, is supported to extend in a vertical direction (longitudinal direction).

The lid 9 is configured to be movable up and down by a boat elevator 11. When the boat elevator 11 is moved down, the lid 9 is moved away from the flange 7, and the substrate loading/unloading port 8 is opened. The wafer boat 10 is moved down to a height so that the wafers W in the wafer boat 10 can be accommodated. After the wafers W are accommodated in the wafer boat 10, the boat elevator 11 is moved up to raise the wafer boat 10 inside the reaction vessel 2, which is shown in FIG. 8. The lid 9 is raised so that it makes contact with the flange 7, thereby air-tightly closing the substrate loading/unloading port 8.

An exhaust port 15 is opened at the side surface over the support portion 6 of the manifold 5. A vacuum exhaust part 19 is connected to the exhaust port 15 via an exhaust pipe 17. A valve 18 is installed in the exhaust pipe 17. One end of each of an etching gas supply pipe 20, three film forming gas supply pipes 21 to 23 and a purge gas supply pipe 33 is connected to the side surface of the manifold 5 at the lower side of the support portion 6. An HBr gas supply source 24 as an etching gas supply source is connected to the other end side of the etching gas supply pipe 20. A dipropylaminosilane (DIPAS) gas supply source 25, a disilane ($Si_2H_6$) gas supply source 26 and a monosilane ($SiH_4$) gas supply source 27 are connected to the other end sides of the film forming gas supply pipes 21 to 23. A nitrogen ($N_2$) gas supply source 34 as a purge gas supply source is connected to the other end side of the purge gas supply pipe 33. In FIG. 8, reference numerals 29 to 32 and 36 denote flow rate adjusting parts, and reference numerals V1 to V5 denote valves.

Moreover, a control part 90 composed of, for example, a computer, is provided in the vertical heat treatment apparatus 1. The control part 90 includes a program, a memory, a data processing part composed of a CPU, and the like. The program contains commands (respective steps) to send control signals from the control part 90 to the respective parts of the vertical heat treatment apparatus 1 to perform respective steps for executing, for example, an etching process and a film forming process. The program is stored in a computer-readable storage medium, namely a memory part such as, for example, a flexible disk, a compact disk, a hard disk, an MO (magneto-optical) disk or the like, and is installed in the control part 90.

The operation of the aforementioned vertical heat treatment apparatus 1 will be described. For example, the wafer W from which the natural oxide film has been removed by wet etching is mounted on the wafer boat 10 within a predetermined period of time, for example, after the wafer W is wet-etched, and is loaded into the reaction vessel 2. Next, the wafer W is heated to 250 to 750 degrees C., for example, 550 degrees C. The internal pressure of the reaction vessel 2 is set to 0.1 to 400 Torr, for example, 20 Torr (2666 Pa). The HBr gas is supplied at a flow rate of 50 to 5000 sccm, for example, 500 sccm. The HBr gas ascends to the inner side of the inner tube 3 from the lower side of the support portion 6 to be supplied to the wafer W. The HBr gas is exhausted from the exhaust port 15 via a gap between the inner tube 3 and the outer tube 4. As a result, the first Si film 104 on the wafer W is etched and removed.

Subsequently, the supply of the HBr gas is stopped, and an inert gas, for example, a nitrogen gas is supplied to replace the interior of the reaction vessel 2 with the inert gas, for example, the nitrogen gas. Furthermore, the temperature of the wafer W is set to 380 degrees C. and the internal pressure of the reaction vessel 2 is set to 1 Torr (133 Pa). Thereafter, the supply of the $N_2$ gas is stopped, and an aminosilane-based gas, for example, a DIPAS gas, is supplied into the reaction vessel 2 at a flow rate of 200 sccm. As a result, a seed layer, which is a nucleus of Si, is formed on the surface of the wafer W.

Then, the supply of the DIPAS gas is stopped, and a $Si_2H_6$ gas is supplied into the reaction vessel 2 at a flow rate of 350 sccm. As a result, the seed layer formed on the surface of the wafer W grows, and a second Si film 111 grows at a film thickness of, for example, 20 Å. Subsequently, the supply of the $Si_2H_6$ gas is stopped, the temperature of the wafer W is set to 470 degrees C., the internal pressure of the reaction vessel 2 is set to 0.45 Torr (60 Pa), and then a $SiH_4$ gas is supplied at a flow rate of 1500 sccm. As a result, Si is further stacked on the second Si film 111 formed on the surface of the wafer W, and the film thickness of the second Si film 111 grows at, for example, 150 Å. Then, the supply of the $SiH_4$ gas is stopped, and the $N_2$ gas is supplied to flow into the reaction vessel 2 to stop the formation of the Si film and the wafer W is heated at 450 to 950 degrees C., for example, 550 degrees C. As a result, in the second Si film 112, the grain size of Si increases.

According to the above embodiment, the first Si film 104 made of polysilicon is etched by the HBr gas in the film structure shown in FIG. 2. Therefore, even in the recess 110 having a high aspect ratio, it is possible to perform etching with high uniformity in the depth direction. As mentioned above, the HBr gas can etch Si with extremely high selectivity with respect to $SiO_2$ and SiN. Therefore, the etching of the $SiO_2$ film 103 or the SiN film 102, which is the underlayer of the first Si film 104, is suppressed (the $SiO_2$ film 103 or the SiN film 102 is substantially not etched). As shown in verification test 3 to be described later, as the film thickness of the second Si film 111 increases, the size of a Si crystal tends to increase. In the above-described embodiment, the impurity layer formed of the etching residue and the like does not remain so that the film thickness of the second Si film 111 is increased correspondingly. When the wafer W is heated, the crystal size of Si increases in the second Si film 112, which has been crystallized after the heating. Thus, high conductivity is obtained.

Furthermore, as shown in verification test 4, when the second Si film 111 is formed after the first Si film 104 is removed by the HBr gas, the film formation rate of the second Si film 111 is not lowered and the surface roughness of the Si film 111 does not deteriorate. Moreover, a step of removing the impurity 107 on the surface of the first Si film 104 and the damaged layer, a step of forming the second Si film 111, and a step of heating the wafer W to crystallize the second Si film 112 can be performed in the same vertical heat treatment apparatus 1. Therefore, it is possible to suppress the adhesion of organic substances and the generation of a natural oxide film at the time of transferring the wafer W.

Second Embodiment

Figure 9:
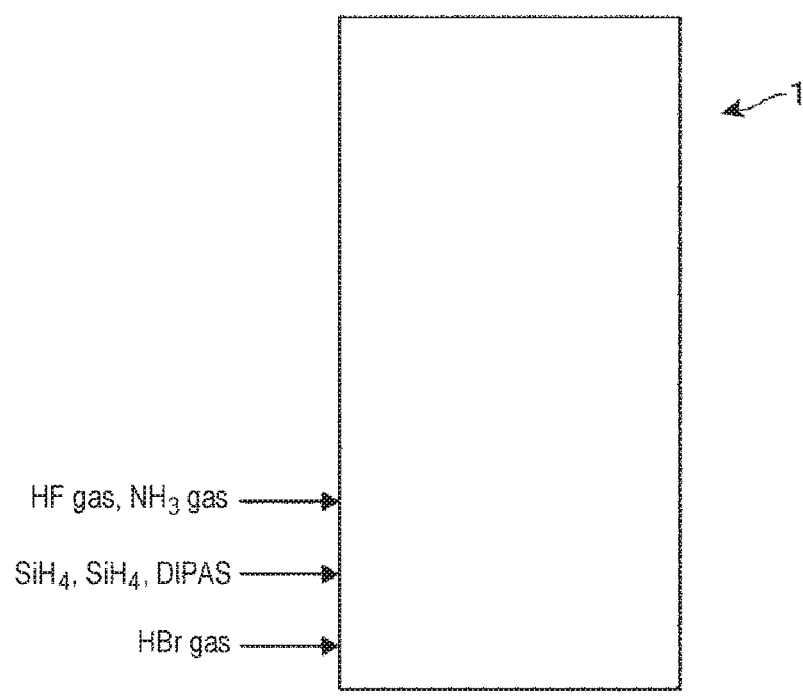
FIG. 9 is a sectional view showing a vertical heat treatment apparatus according to a second embodiment.

As a method of manufacturing a semiconductor device according to the second embodiment, the natural oxide film on the surface of the first Si film 104 may be removed by dry etching, and the dry etching may be performed within the vertical heat treatment apparatus. For example, as shown in FIG. 9, an HF gas and an $NH_3$ gas are supplied to the vertical heat treatment apparatus 1. FIG. 9 schematically shows the vertical heat treatment apparatus 1 shown in FIG. 8. The HF gas and the $NH_3$ gas are supplied to, for example, the lower side of the support portion 6 in the manifold 5 shown in FIG. 8.

In the second embodiment, the wafer W shown in FIG. 2, which has been subjected to anisotropic etching, is loaded into the vertical heat treatment apparatus 1 shown in FIG. 9. Then, the HF gas and the $NH_3$ gas are supplied into the reaction vessel 2. As a result, HF and $NH_3$ are adsorbed on the surface of the natural oxide film in the recess 110 of the wafer W. Since these gases react with the natural oxide film ($SiO_2$) to generate $(NH_4)_2SiF_6$ (ammonium silicon fluoride), the natural oxide film is removed by heating the wafer W to thereby sublimate the $(NH_4)_2SiF_6$. Thereafter, the etching of the damaged layer of the first Si film 104 is performed by supplying the HBr gas and the subsequent formation of the second Si film 111 may be performed. In the second embodiment, after removal of the natural oxide film, the etching of the damaged layer of the first Si film 104 by the supply of the HBr gas and the subsequent formation of the second Si film 111 may be continuously performed without unloading the wafer W from the apparatus. Therefore, it is possible to suppress the adhesion of organic substances and the generation of a natural oxide film when transferring the wafer W between apparatuses.

Furthermore, the natural oxide film of Si can be etched using a process gas containing a compound including nitrogen, hydrogen and fluorine, for example, an ammonium fluoride ($NH_4F$) gas. Even in this case, the process gas reacts with the natural oxide film of Si to generate $(NH_4)_2SiF_6$. Accordingly, the ammonium fluoride ($NH_4F$) (or $NH_4FHF$) gas may be supplied when etching the natural oxide film of Si. The process gas may be a mixed gas of an $NH_3$ gas, an HF gas and an $NH_4F$ gas (or an $NH_4FHF$ gas).

Furthermore, as for the removal of the first Si film 104 by the supply of the HBr gas, the etching residue 107 may adhere to the first Si film 104, only the surface layer portion including the damaged layer damaged by the anisotropic etching may be removed, and a part of the first Si film 104 may be left. In addition, when removing the damaged layer and the layer containing impurities in the first Si film 104, a similar effect can be expected by using a hydrogen iodide (HI) gas instead of the HBr gas.

[Verification Test 1]

Figure 10A:
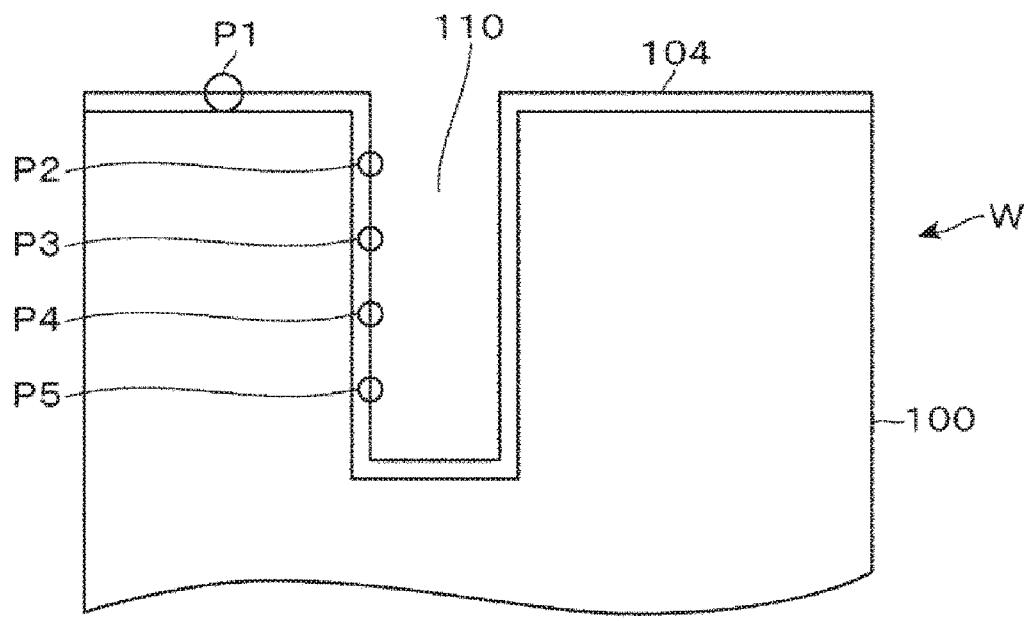
FIGS. 10A and 10B are characteristic diagrams showing an etching amount in a depth direction of a recess.

In order to verify the effects of the present disclosure, the uniformity in etching amount in the depth direction of the recess 110 was investigated when the first Si film 104 formed within the recess 110 formed in the $SiO_2$ layer 100 of the wafer W is etched using an HBr gas. A wafer W in which the recess 110 having a depth of 1500 nm and a width of 40 nm is formed and the first Si film 104 is formed on the surface thereof was used as shown in FIG. 10A.

Figure 10B:
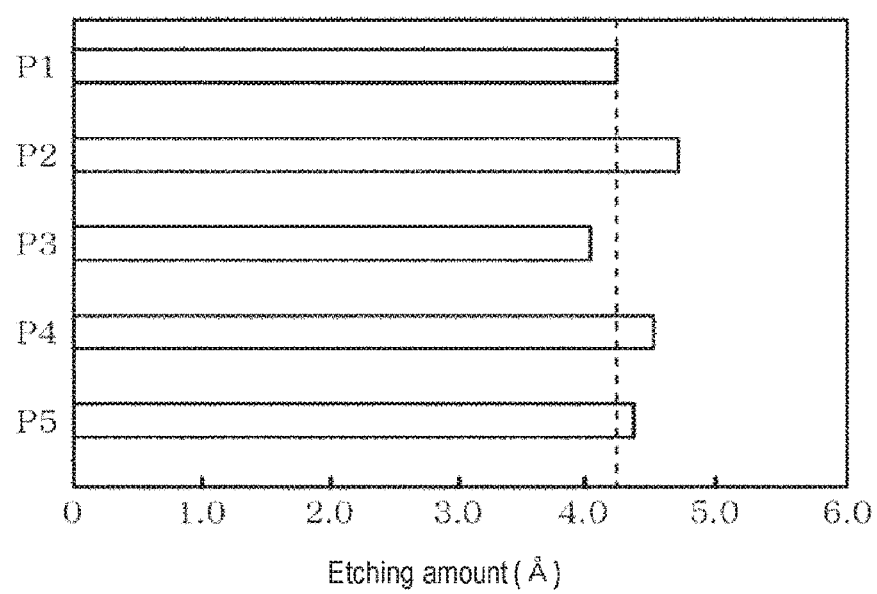

The etching was performed with respect to the wafer W using the vertical heat treatment apparatus 1 described in the first embodiment and the HBr gas, and the etching amount was measured at five points of height positions P1 to P5. P1 indicates the surface of the wafer W and P2 to P4 indicate the height positions of 300 nm, 600 nm, 900 nm and 1200 nm in the depth direction of the recess 110 from the height of the surface of the wafer W on the side wall of the recess 110, respectively. FIG. 10B shows the result and indicates the values obtained by averaging, for each of P1 to P5, the etching amounts at the respective height positions P1 to P5 measured in each wafer W. According to this result, the etching amount at P1 on the surface of the wafer W is 4.25 Å. Assuming that the etching amount at P1 is 100, the etching amounts at P2 to P4 inside the recess 110 are 95.3 to 110.9.

As can be noted from this result, the Si film 104 formed on the side wall of the recess 110 can be etched uniformly in the depth direction of the recess 110 by etching the Si film 104 using the HBr gas.

[Verification Test 2]

In order to verify the effects of the present disclosure, the etching selectivity of the Si film, the $SiO_2$ film and the SiN film by the HBr gas was investigated. First, a Si film, a $SiO_2$ film and a SiN film were respectively formed on the surface of a test wafer. The test wafer was heated at 550 degrees C. using the vertical heat treatment apparatus 1 described in the first embodiment. Etching was performed by supplying an HBr gas to the test wafer. In addition, the test wafer on which a Si film is formed was heated at 530 degrees C. Etching was performed by supplying an HBr gas to the test wafer.

Figure 11:
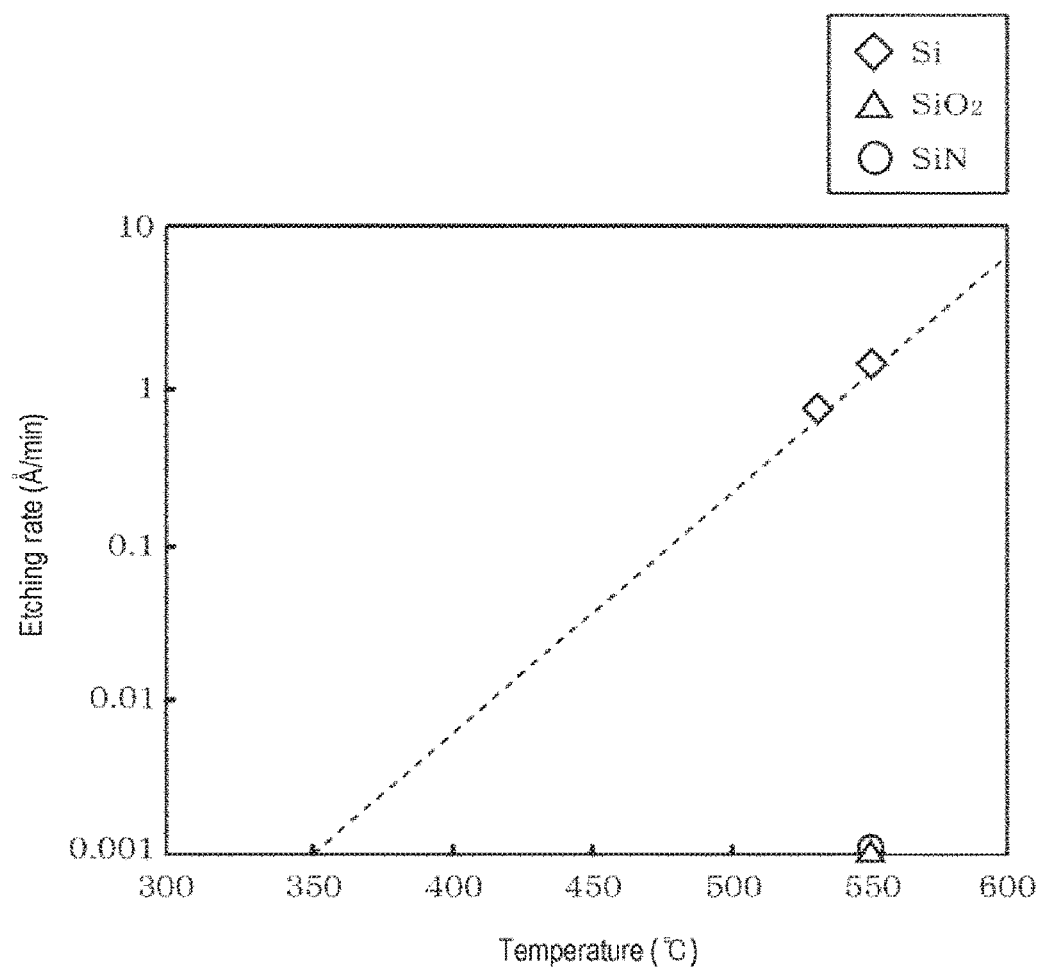
FIG. 11 is a characteristic diagram showing an etching rate by an HBr gas.

FIG. 11 shows this result and indicates the etching rates (Å/min) of the Si film, the $SiO_2$ film and the SiN film with respect to the heating temperature of the inspection-purpose wafer. When the test wafer was heated at 550 degrees C. and the etching was performed, the Si film was etched. However, the $SiO_2$ film and the SiN film were hardly etched (not substantially etched). Even when the test wafer was heated at 550 degrees C., the Si film was largely etched. According to this result, it can be said that the Si layer can be etched with a high selectivity with respect to the $SiO_2$ film and the SiN film when the wafer W is heated and the HBr gas is supplied.

[Verification Test 3]

Figure 12:
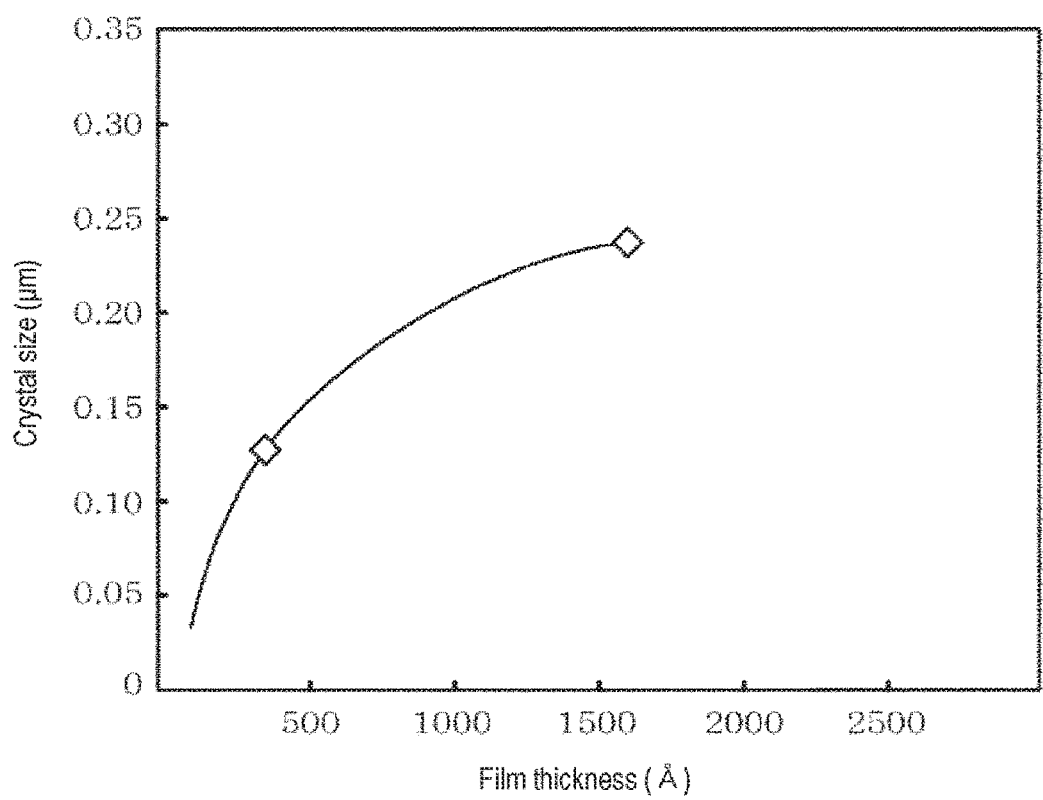
FIG. 12 is a characteristic diagram showing the relationship between a film thickness of a Si film and a particle size.

Furthermore, the relationship between the film thickness of the Si film and the crystal size was investigated when the Si film was formed on the test wafer and heated to crystallize Si. Each of the test wafers in which the film was formed at 400 Å and 1500 Å by the vertical heat treatment apparatus 1 described in the first embodiment, was heated at 550 degrees C., and the crystal size was investigated. FIG. 12 shows this result. FIG. 12 is a characteristic diagram showing the relationship between the film thickness of the formed Si film and the crystal size of Si. As shown in FIG. 12, it can be noted that as the film thickness of the Si film becomes larger, the crystal size of Si increases.

[Verification Test 4]

Depending on the type of dry etching gas, deterioration such as surface roughness deterioration or the like may be observed in the film formed after etching due to the component of the gas remaining on the wafer W after etching. In view of this, after forming a first Si film on the test wafer, the entire Si film was etched with an HBr gas. Then, a second Si film was formed. The surface roughness and the film thickness of the formed Si film were investigated. The formation of the first Si film was performed by using the vertical heat treatment apparatus 1 described in the first embodiment and by setting the target film thickness to 5.0 nm. Next, in the same vertical heat treatment apparatus 1, the entire Si film was removed by supplying an HBr. Thereafter, in the same vertical heat treatment apparatus 1, a Si film was formed by setting the target film thickness to 3.5 nm.

In the formation of the first Si film, the Si film was formed at a film thickness of 5.1 nm. The surface roughness Ra thereof was 0.167. Then, the surface roughness Ra after etching the first Si film was 0.198. In the formation of the second Si film, the Si film was formed at a film thickness of 3.62 nm. The surface roughness Ra thereof was 0.141. According to this result, when the etching is performed by the HBr gas and the Si film is formed again, the surface roughness Ra was not reduced. The film thickness of the Si film was also substantially equal to the target film thickness. The film formation efficiency was not decreased even after etching the Si film by the HBr gas.

According to the present disclosure in some embodiments, by dry-etching a part of a silicon film formed in a recess on a substrate, a silicon film remaining on a side wall in the recess and having an etching residue adhered to the surface of the silicon film is partially or entirely removed by an etching gas selected from a hydrogen bromide gas and a hydrogen iodide gas. Therefore, the silicon film having impurities adhered to the surface thereof is removed with high uniformity in the depth direction. This makes it possible to form the silicon film on the inner surface of the recess with a large thickness in the subsequent film forming process. Accordingly, when heating the substrate to anneal the silicon film, the particle size of the silicon film becomes large and the conductivity becomes good.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    loading a substrate into a process container after dry-etching a portion of a silicon film formed in a recess on the substrate;
    performing etching to partially or entirely remove the silicon film remaining on a side wall inside the recess by supplying an etching gas selected from a hydrogen bromide gas and a hydrogen iodide gas into the process container of a vacuum atmosphere while heating the substrate;
    subsequently forming a silicon film inside the recess; and
    heating the substrate to increase a grain size of the silicon film.

2. The method of claim 1, wherein a portion of a silicon oxide film is exposed in the substrate loaded into the process container.

3. The method of claim 1, wherein a portion of a silicon nitride film is exposed in the substrate loaded into the process container.

4. The method of claim 1, wherein monocrystalline silicon is exposed on a bottom surface of the recess of the substrate loaded into the process container, and the monocrystalline silicon forms a conductive path together with the silicon film.

5. The method of claim 1, wherein the performing etching, the forming a silicon and the heating the substrate are sequentially performed in the same process container.

6. The method of claim 1, further comprising performing a COR process in the same process container before the performing etching.

7. The method of claim 1, wherein a process temperature in the performing etching is set to 250 degrees C. to 750 degrees C.

8. A heat treatment apparatus configured to mount a substrate for manufacturing a semiconductor device on a mounting part provided in a process container for forming a vacuum atmosphere and to perform a heat treatment with respect to the substrate by supplying a process gas while vacuum-exhausting an interior of the process container and heating the substrate, the heat treatment apparatus comprising:
    a control part configured to output a control signal so as to perform:
        loading the substrate into the process container after dry-etching a portion of a silicon film formed in a recess on the substrate;
        etching to remove an etching residue of a surface portion of a silicon film remaining on a side wall inside the recess or the silicon film by supplying an etching gas selected from a hydrogen bromide gas and a hydrogen iodide gas into the process container of a vacuum atmosphere while heating the substrate;
        subsequently forming a silicon film inside the recess; and
        heating the substrate to increase a grain size of the silicon film.

9. The apparatus of claim 8, wherein after performing the loading the substrate into the process container, the control part further performs performing a COR process before the etching.

10. A non-transitory computer-readable storage medium storing a computer program used in a heat treatment apparatus configured to mount a substrate for manufacturing a semiconductor device on a mounting part provided in a process container for forming a vacuum atmosphere and to perform a heat treatment with respect to the substrate by supplying a process gas while vacuum-exhausting an interior of the process container and heating the substrate,
    wherein the computer program includes a group of steps so as to execute the method of manufacturing a semiconductor device of claim 1.

* * * * *